United States Patent [19]
Jost et al.

[11] Patent Number: 5,405,448
[45] Date of Patent: Apr. 11, 1995

[54] APPARATUS FOR PRODUCING A PROTECTIVE COATING ON SUBSTRATES

[75] Inventors: Stephen Jost, Trübbach, Switzerland; Leonhard Senn, Mauren, Liechtenstein

[73] Assignee: Balzers Aktiengesellschaft, Liechtenstein

[21] Appl. No.: 154,946

[22] Filed: Nov. 19, 1993

Related U.S. Application Data

[62] Division of Ser. No. 947,709, Sep. 18, 1992, Pat. No. 5,298,290.

[30] Foreign Application Priority Data

Sep. 20, 1991 [CH] Switzerland .................. 2793/91

[51] Int. Cl.$^6$ ............................................. C23C 16/50
[52] U.S. Cl. ........................ 118/723 E; 118/723 MW; 118/715
[58] Field of Search ..... 118/723 E, 723 ER, 723 MP, 118/723 MW, 723 ME, 723 MR, 723 MA, 715; 156/345

[56] References Cited

U.S. PATENT DOCUMENTS

| | | | |
|---|---|---|---|
| 4,615,298 | 10/1986 | Yamazaki | 118/723 E X |
| 4,808,258 | 2/1989 | Otsubo et al. | 156/345 X |
| 5,006,220 | 4/1991 | Hijikata et al. | 118/723 E X |

FOREIGN PATENT DOCUMENTS 58-93241  6/1983  Japan .

*Primary Examiner*—R. Bruce Breneman
*Assistant Examiner*—Jonathan D. Baskin
*Attorney, Agent, or Firm*—Notaro & Michalos

[57] ABSTRACT

A method and apparatus for applying a protective coating onto a substrate comprises a power supply for generating an amplitude-modulated alternating electromagnetic field in a vacuum chamber. A silicon-organic compound is supplied in a gaseous state into the vacuum chamber and is plasma polymerized onto the substrate in the chamber without powdery portions. Another process parameter for controlling coating rate is adjusted to be at a high level so that when the amplitude modulation is stopped, powdery portions do appear in the coating. Thus at high coating rates amplitude-modulation according to the invention avoids such powdery portions.

20 Claims, 3 Drawing Sheets

APPARATUS FOR PRODUCING A PROTECTIVE COATING ON SUBSTRATES

This application is a division of application Ser. No. 07/947,709, filed Sep. 18, 1992, now U.S. Pat. No. 5,298,290.

FIELD AND BACKGROUND OF THE INVENTION

The present invention relates in general to a method of forming a protective coating on a substrate by means of plasma polymerization with at least one gaseous silicon-organic compound, in which a plasma is generated in a vacuum chamber and a gas with the compound is fed thereto for the production of the coating. The invention relates further to a coating apparatus with a coating chamber, a source arrangement which, for the generation of a plasma, generates an electromagnetic alternating field, a pumping arrangement connected to the chamber, and a controlled gas inlet arrangement for the infeed of gas into the chamber.

In the technology of protective coatings it is generally known to provide substrates, specifically non-planar substrates such as reflectors for automobile or other headlights, floodlights, etc. with corrosion proof or wiping resistant, protective coatings.

Plasma polymerization which, as is generally known, is used for this task, and which is a plasma enhanced chemical deposition method operative at comparatively low substrate temperatures, permits metal substrates or previously coated metal layers, specifically aluminum vapor coated substrates, to be coated with siloxane, a silicon-organic compound.

Because a plasma is generated for this procedure by direct current, as disclosed, for example, in the German patent publication DE-OS 22 63 480 or French patent reference FR A 21 690 072, a new metal encasement must be furnished from time to time, around at least one of the metal electrodes used for the coating process and between which the plasma is generated after every coating process. This is because an insulating coating is produced at relatively high coating rates on the electrode during coating with siloxane. Without this new metal encasement, the longer the process continues, the more dielectric coating is formed on the electrode. This would lead to an unstable plasma with flashovers through the insulating coating and contamination of the coating process area, sputtering-off until, finally, a disruption or break down of the plasma discharge takes place.

This problem remains if, according to German reference DD A 272 773, a pulsed DC-plasma is used. According to DD A 272 773, an alternating voltage of selected frequency is rectified in one direction and is used for the plasma generator. By means of a superimposed DC-voltage, the total voltage is raised causing the plasma discharge to intensify which, it is said, increases productivity. It is also stated in the reference that an upper limit for this DC-voltage exists, above which the discharge becomes continuous. This pulsed switching of a discharge with a non-pulsed operating voltage (a rectified voltage) can no longer support pulsed DC-discharge operation. A pulsed DC-discharge is used according to DD A 272 773 for preventing arcing, which, as is known, is often encountered in pure DC-discharge operation.

Due to the necessity of having to reencapsulate the mentioned electrode, relatively long maintenance intervals occur due to which a production plant must often shut down for prolonged time spans. This can not be tolerated with in-line production plants, for example.

It is noted that the parameters for a plasma polymerization method depend very strongly on the gaseous compounds used and which will thus form the process coating. It is known from European patent reference EP A 207 767, to pulsate RF plasma, during a surface treatment-etching or coating by plasma enhanced reactive processes. Without any specific selection, a large number of different materials are proposed for processing in this reference, e.g., $Si_3N_4$, $TiO_2$, $Al_2O_3$, BN, $SiO_2$, $B_4C$, SiC, HC, TiC, TiN, BP. All of these coating materials are not produced by polymerization.

In case of the plasma polymerization of silicon-organic compounds, it is known, e.g. from EP A 0 299 754 to generate the plasma by means of an electromagnetic alternating field. It is further known that, when using certain non-silicon organic gaseous compounds such as methane, higher deposition rates can be obtained by pulsing the electromagnetic alternating field, and at the same applying average power.

How the coating process behaves, as noted above, depends on plasma modulation, and to a large extend, on the specific gaseous compound supplied for the coating operation.

Regarding the recognition that it is possible to reach, in certain cases, higher coating rates by a pulsed electromagnetic alternating field for the generation of the plasma at the same average electrical power applied also under the same process conditions, reference is made to:

Vinzant J., Shen M., Bell A. ACS SYMP.SER; SHEN BELL 108 p. 79 (1979), "Polymerization of Hydrocarbons in a pulsed plasma";

H. Yasuda, T. Hsu: J. Polym Sci, Polym Chem ed 15, 81, (1977), or

H. Yasuda "Plasma polymerization" Academic press (1985), p.103–105; and

Lloret A., Bertran E., Andujar J., Canillas A., Morenza J., J.APPL.PHYS. 69, p. 632 (1991), "Ellipsometric study of a-Si:H thin films deposited by square wave modulated rf glow discharge".

Further, that a lower heat loading of the substrate takes place by the application of a pulsed electromagnetic alternating field for the generation of the plasma follows from:

GB A 2 105 729 (1981), ITT Industries Ltd., London-GB; and

U.S. Pat. No. 4,950,956 (1990), Anelva Corp., Tokyo, Japan.

It is furthermore, also known that new coating properties are realized by the application of a pulsed electromagnetic alternating field for the generation of a plasma. Reference is made in this respect to:

JP 62 103 371 (1985), Hitachi KK;

DD 264 344 A3 (1986), VEB ZFT Mikroelectronik.

Improvement in the purity of the layer or a reduction of powdery layer portions is known:

in relation to the depositing of diamond or graphite out of methane, from JP 62 123 096 (1985), Showa Denko KK;

for silane ($SiH_4$) from: Watanabe Y., Shiratani M., Kubo Y, Ogawa I., Ogi S., APPL.PHYS.LETT. 53, —p. 1263 (1988), "Effects of low frequency modulation on rf-discharge chemical vapor deposition";

with reference to the deposition of amorphous carbon from methane, from Hossary F., Fabian D., Webb A., THIN SOL.FILM 192, p.201 (1990), "Optical properties of amorphous carbon films formed by rf-plasma deposition from methane"; and again with reference to silane ($SiH_4$) further reference is made to: Watanabe Y., Shiratani M., Makino H., APPL.PHYS.LETT. 57, p. 1616 (1990), "Powder-free plasma chemical vapor deposition of hydrogenated amorphous silicon with high rf power density using modulated rf discharge."

All of the above documents are to be taken as an integrated part of the present description and are to be considered as incorporated in the present description by reference.

SUMMARY OF THE INVENTION

It is a general object of the present invention to provide a method of the kind referred to above, i.e. for the production of protective coatings by means of a plasma polymerization of a gaseous silicon-organic compound, in which the mentioned electrode maintenance intervals are significantly lengthened and in which, additionally, an as high as possible coating rate is achieved while preventing powder-like portions of the coating material to deposit on the substrate.

This is achieved by producing plasma by means of an amplitude-modulated electromagnetic alternating field and by setting the coating rate by setting at least one of the coating process parameters which determine the coating rate to such a high value that upon a stopping of the modulation of the amplitude of the electromagnetic alternating field, and while keeping its amplitude constant at a maximal value of the modulation, the produced protective coating would include substantial powdery portions.

It has thus been found that the mentioned object of the invention, namely to reduce the intervals between needed maintenance for the electrodes, is achieved using a plasma-polymerization deposition process for silicone-organic compounds which is performed with a plasma generated using modulated electromagnetic alternating fields. Further, the coating rate can be substantially increased by setting selected process parameters, without the protective coating including any powdery portions which would have been expected for the same process settings but without amplitude modulation to the present invention. Such powdery portions occur immediately upon stopping of the amplitude modulation of the electromagnetic alternating field of the invention, even when the selected parameter, for example, the average electric power supplied, is significantly lower than its highest setting for maximum coating rate. This further proves the effectiveness of the invention to avoid the powdery portions.

Although it is known that when using certain monomers, specifically those with double bonds, higher coating rates may be reached by using plasma generated by an alternating field pulsed up to the microwave range, this was with the average electrical power being supplied remaining unchanged, and also for unchanged process parameters. This would be a special case of amplitude modulation where the pulsing rate of the modulation is equal to the frequency of the alternating field. It is also known that for silane ($SiH_4$) and for hydrocarbons, it is possible to reduce contamination of the coating by reducing the application of pulsed plasma generating alternating fields, it has been recognized by the present inventors and according to the present invention that in the case of plasma polymerization with silicon-organic compounds, the rate of deposition can be increased considerably by an increase in the corresponding process parameters, such as average electric power supply, without any contamination to the coating. According to the prior art, contamination during the silicon-organic compound (e.g. silane) coating would have occurred under the prior art conditions.

Still a further object of the intention is to provide a method where the electromagnetic alternating field is produced in accordance with at least one of following: a) by amplitude modulation of an alternating signal generator for the generation of the alternating field; b) by a timed switching of at least two alternating signal generators of differing signal amplitudes for the production of the amplitude modulated alternating field; and-/or c) by a timed switching of coupling means for any alternating signal from one alternating signal generator into the vacuum chamber.

Thus, the amplitude modulation of the electromagnetic alternating field for the generation of the plasma is realized by an amplitude modulation of an alternating signal generator and/or by a timed switching of at least two alternating signal generators of differing signal amplitudes and/or by a timed switching of the coupling-in means for the alternating signal from an alternating signal generation into a vacuum chamber used with the process such as, for instance, by a timed changing of a coupling-in of the power from a microwave generator or by a timed switching of an RF alternating signal generator to different pairs of electrodes between which the plasma is produced.

A further object of the invention is to provide a method wherein at least one of the following parameters is set as a process parameter which determines the coating rate: electric power supplied and/or pressure and/or flow rate of the gaseous silicon-organic compound and/or carrier frequency of the amplitude modulated alternating signal.

A further object of the invention is to provide a method wherein the alternating field is amplitude modulated by switching on and off, the ouput signal of an alternating signal generator. Thereby packages of alternating signals are intermittently produced for the excitation of the plasma.

Yet a further object of the invention is to provide a method wherein the frequency of the modulation of the alternating field is held constant and preferably in the range between 1 Hz and 1 kHz inclusive.

A further object of the invention is to provide a method wherein a frequency between 1 kHz (inclusive) and microwave frequencies is selected as the carrier frequency, whereby the efforts for the concrete embodiment are especially low in the microwave range above 0.5 GHz (inclusive), and in the HF-range especially between 1 kHz and, 1 MHz inclusive. Extremely good results where attained by using a carrier frequency in the range between 10 kHz and 500 kHz inclusive.

Still a further object of the invention is to provide a method wherein if the plasma is generated between at least two electrodes, at least one of the electrodes is encapsulated dielectrically toward the plasma discharge space, which is possible without any further problems due to the alternating field plasma excitation. This leads to the fact that in spite of a possible dielectric coating of the electrodes, only little change of the impedance conditions result along the plasma discharge path.

A further object is to provide a method in which a gas outlet is located relative to the plasma discharge space behind one of the electrodes, preferably having the shape of at least one gas inlet shower head and further preferably being provided with a screen-like fine gas distributing arrangement located downstream of the gas inlet.

Also, a further object is to provide a method wherein the amplitude modulation of the alternating field is generated by pulsing and wherein the pulse length amounts to from 10% to 90% of the pulse repetition period, preferably about 50% thereof.

A further object of the invention is to provide a method in which a non-planar substrate is coated, specifically in the form of a reflector. Despite this, a uniform protective coating without deposition of powder is still realized.

A still a further object of the invention is to provide a method in which preferably at least one of the following silicon-organic compounds is applied, namely siloxanes and/or alkyl-/alkoxy-silanes, especially hexamethyl-disiloxane and/or diethoxy-dimethyl-silane.

Yet a further object is to provide a method wherein hexamethyl-disiloxane is used as the gaseous compound, which compound gives rise to low costs, leads to extremely stable coating conditions, is not dangerous and is extremely practically for use.

A further object of the invention is to provide a coating apparatus having a source arrangement adapted to generate an amplitude modulated alternating field, in a vacuum chamber, and having a gas container arrangement with a silicon-organic compound connected to a gas inlet arrangement.

A still further object is to provide a coating arrangement wherein a liquid silicon-organic compound in a gas container arrangement is transferred to the vacuum in a gaseous state. This especially if the gas container arrangement contains hexamethyl-disiloxane.

Further objects of the invention are commensurate with the appended apparatus claims.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

The invention will be better understood and objects other than those set forth above, will become apparent when consideration is given to the following detailed description thereof. Such description makes reference to the annexed drawings wherein.

DESCRIPTION OF THE PREFERRED EMBODIMENTS

Figure 1:
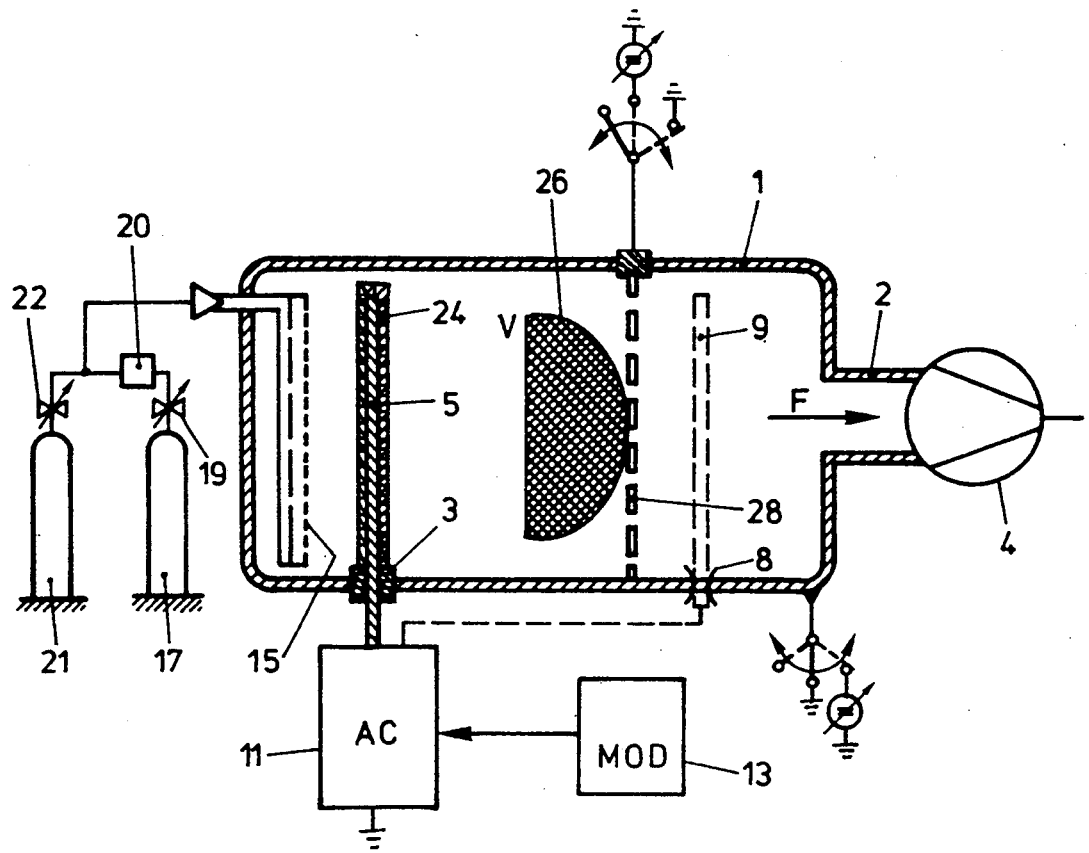
FIG. 1 is a schematic top view of a coating apparatus of the invention, for practicing the inventive method.
Figure 2:
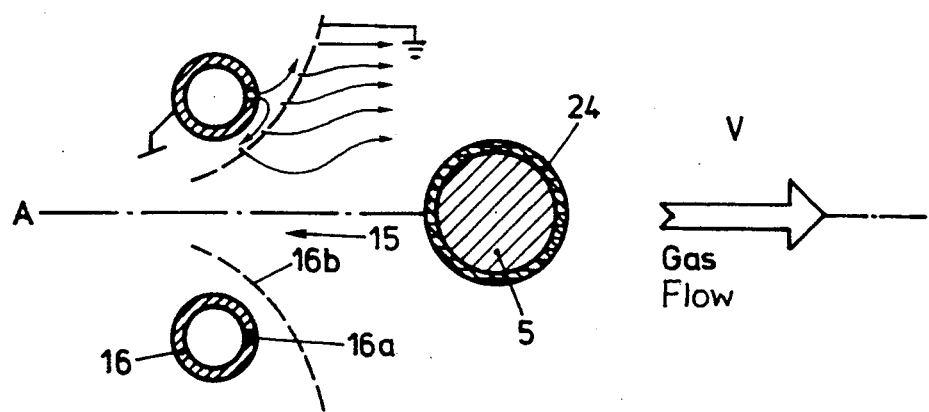
FIG. 2 is a schematic side view of a preferred gas supply for the apparatus according to FIG. 1.

According to FIG. 1 and 2 an inventive treatment apparatus includes a vacuum chamber or plasma recipient 1 with a pumping connection 2 for evacuating the chamber 1 and also for maintaining a gas glow through the chamber in the direction of the arrow F.

A first electrode 5 structured preferably as a bar electrode, is located in the chamber 1 and is electrically insulated from the chamber as schematically illustrated at insulator 3. At least a part of the wall 8 of the chamber 1, or a counter electrode 9 as illustrated by broken lines and which is electrically insulated relative to the chamber 1, act as a counter electrode. If electrode 9 is used the chamber casing is connected to reference potential, e.g. to ground potential. The following kinds of operations can be followed:

(a) without electrode 9; chamber 8 at reference potential A, and support 28 at reference potential A or B≠A, or support 28 at floating potential; or with casing 8 floating; and support 28 at reference potential.

(b) with electrode 9; casing 8 at reference potential A, support 28 at reference potential A or B≠A, support 28 at floating potential or support 28 lead along on an alternating potential; or with casing 8 at floating potential; support 28 at reference potential or support 28 at floating potential.

Figure 4A:
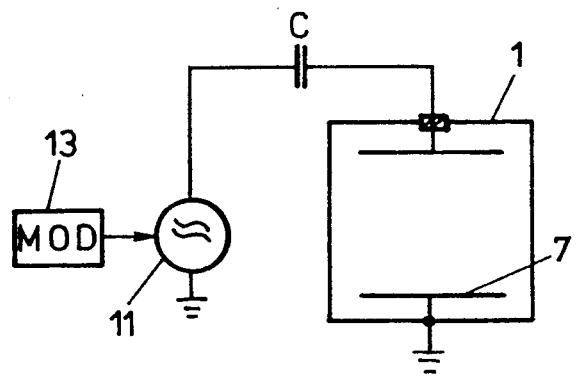
FIGS. 4a to 4c illustrate, on an exemplary basis, various kinds of modulation of a plasma generating alternating voltage together with the presently preferred one.
Figure 4B:
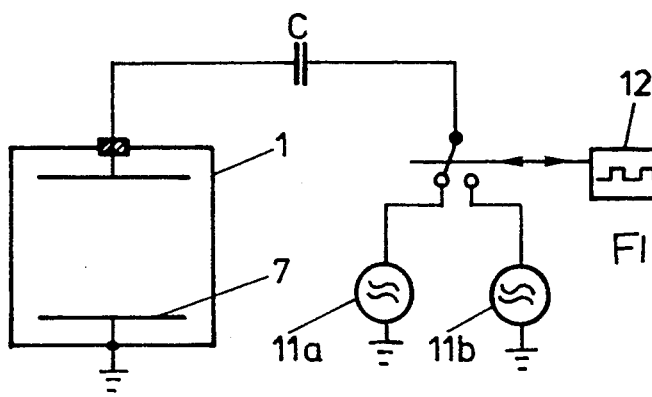
Figure 4C:
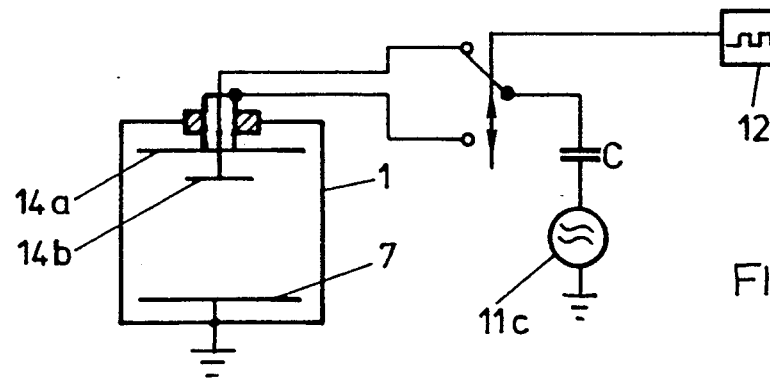

The inventive amplitude modulation of the applied alternating field proceeds basically in one of the variants illustrated in FIGS. 4a to 4c.

According to FIG. 4a, an alternating signal generator 11 is amplitude modulated by a modulating unit 13.

According to FIG. 4b two or possibly more than two generators 11a, 11b, operated preferably at the same frequency but at different amplitudes are foreseen and are switched, timed by a timing unit 12 to the vacuum chamber 1 for the generation of plasma.

According to FIG. 4c one single alternating signal generator 11c is switched or coupled-into different plasma discharge paths 14a and 14b, in the vacuum chamber 1.

The technique as illustrated in FIGS. 4a to 4c use carrier frequencies up and into the HF-range. In the microwave range corresponding microwave generators are coupled to the vacuum chamber 1.

Furthermore, in FIGS. 4a to 4c, one of the electrodes 7 is illustrated as connected to the vacuum chamber casing and connected to reference potential, e.g. ground potential. These electrodes 7 can also be operated in an electrically insulated manner, relative to the vacuum chamber casing. In such case the casing of the vacuum chamber is connected to a reference potential, e.g. ground potential.

By means of the indicated capacities C the respective electrode is DC-decoupled from the generator such that it can float at floating potential.

In FIG. 1 and following the procedure according to FIG. 4a, an alternating signal generator 11 is coupled between the electrode 5 and a counter electrode, either the wall 8 of the chamber 1 or an insulated counter electrode 9. The generator 11 supplies an alternating voltage with a carrier frequency between 1 kHz and microwave range (microwave range: $10^9$ Hz–$10^{12}$ Hz), preferably between 1 kHz and 1 MHz (both inclusive), or in the microwave or upper RF, range preferably above 0.5 GHz (inclusive).

In operation of the apparatus the apparatus specific carrier frequency $f_o$ of the generator is selected to be 11 370 kHz.

Preferably 10 kHz $\leq f_o \leq$ 500 kHz is selected in the RF range.

Furthermore, switching on and off of the plasma excitation alternating voltage applied between electrode 5 and counter electrode 9 or 7, is preferably realized by the modulation generator 13.

Figure 3A:
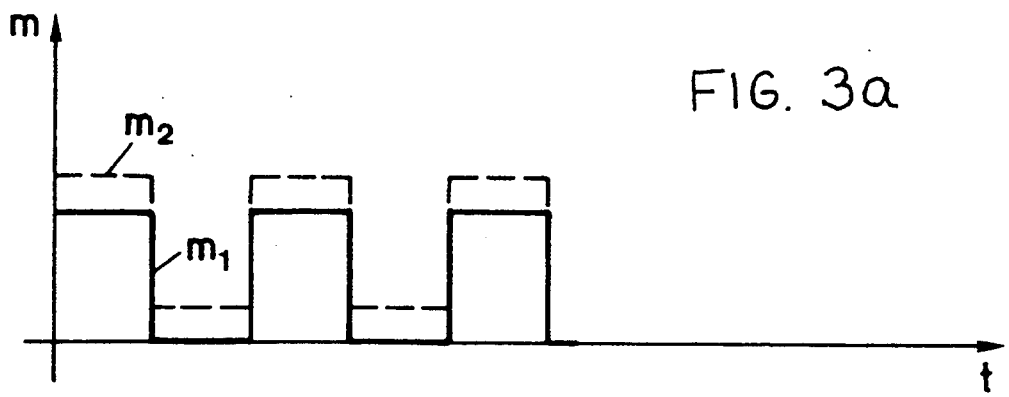
FIGS. 3a to 3 c schematically illustrate various possibilities for the generation of the amplitude modulated alternating field applied in accordance with the present invention.
Figure 3B:
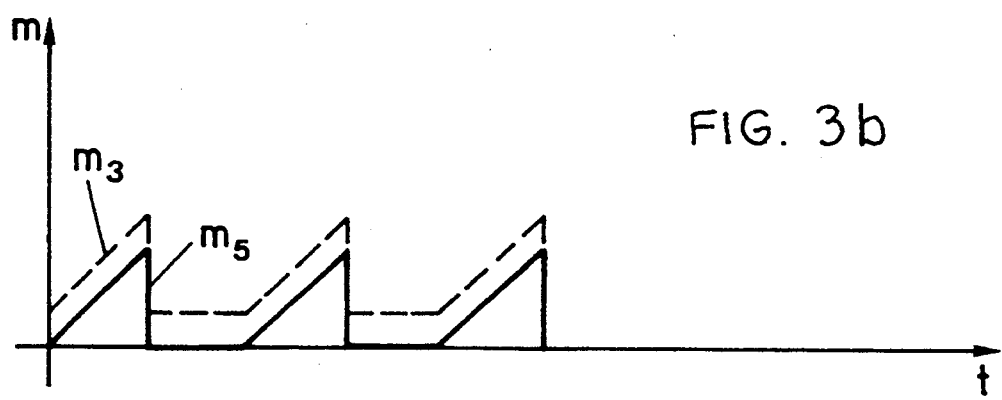
Figure 3C:
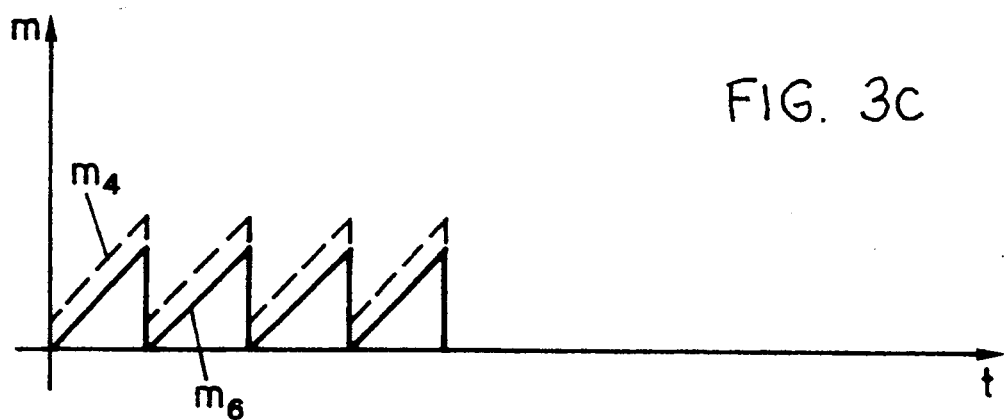

In FIGS. 3a to 3c, modulation signals m are schematically illustrated with reference to the time axis. Presently it is preferred to apply a square modulation of the applied alternating voltage such as illustrated at $m_1$, and with a duty cycle of 1 and further with a modulation frequency of 10 Hz. It is, however, possible, as illustrated by the square modulation at $m_2$ in broken lines, to modulate between a maximal alternating voltage value and a non-disappearing minimal value, as illustrated or use triangle modulations shown at $m_3$ or $m_4$.

In the modulation schemes according to $m_5$ and $m_6$ the excitation alternating voltage is again set intermittently to zero.

It is possible to apply also further modulation curves besides the preferably applied and illustrated square modulation and the also illustrated triangle modulation.

With regard to the depositing or process space V between the preferably water cooled (not illustrated) electrode 5 and the counter electrode 7 or 9, behind the electrode 5, a preferably shower head like gas inlet 15 is used which at the one side is connected via flow controller 19 to supply container 17 for the silicon-organic compound, preferably for a siloxane, thereby preferably hexamethyl-disiloxane, or for an alkylaloxyl-silane, thereby especially a diethoxy-dimethylsilane mixture of two or more of these gases. At the other side it is also possible to connect a supply container 21 for a carrier gas such as Helium and/or Argon and/or Nitrogen also via a flow controller 22 to the gas inlet 15.

Preferably, hexamethyl-disiloxane is foreseen in the container 17. Because most of the compounds used in accordance with the invention are liquid at room temperature, an evaporating unit 20 is used in most cases, i.e. the compound is stored in a tank or supply container 17, in a liquid state and evaporated into the chamber 1.

According to the illustration in FIG. 2 the gas inlet includes preferably two or more gas supply shower heads 16 with openings 16a pointing toward the plasma space V, which are parallel to the electrode and to the axis A of the chamber. The. gas inlet 15 is located, relative to the direction of gas flow, upstream of the electrode 5. The desired distribution of the gas, preferably laterally around the electrode 5, is obtained by means of grids 16b, which prevent also an igniting of plasma at the openings 16a. The gas inlet 15 is preferably connected to a reference potential such as to ground potential.

Furthermore, at least one of the electrodes, such as illustrated electrode 5, is provided with an electrically insulating or dielectric jacket 24, thereby a coating of the electrode during the coating process of the substrate can no longer substantially change the conditions of impedance along the discharge path.

The substrate illustrated is a reflector shaped substrate, for instance a metal coated headlight reflector. The substrate 26 is positioned in the process space V between the electrode 5 and the counter electrode 9 or 7, on a support 28 galvanically connected to the substrate, and insulated from the chamber. Support 28 only little disturbs the gas flow, and which is at a free floating potential in the treatment space. Thus substrate 26 is also free floating.

The illustrated apparatus was used to perform the Example listed below and a comparative example labeled Comparison. A highly milky coating, thus with a high powder-like portion was formed using the comparative example (see under Comparison). No milky coating was found when the inventive method was practiced (see under Example). In both cases the same apparatus and also the same substrate to be coated, was used.

| Paramater | Example | Comparison |
|---|---|---|
| Average power supplied | 200 W | 200 W |
| Carrier frequency $f_o$ | 370 kHz | 370 kHz |
| Gas pressure ($\mu$bar) | 50 | 50 |
| Reactive gas flow (sccm) | 130 | 130 |
| Reactive gas | HMDSO | HMDSO |
| Carrier gas flow (sccm) | 170 | 170 |
| (sccm = standard cubic centimeter) | | |
| Carrier gas | $N_2$ | $N_2$ |
| Kind of modulation | square on/off | not mod. |
| Modulation frequency | 10 Hz | — |
| Duty cycle | 1 | — |
| Coating rate (Å/sec) | 20 | 20 |
| Length of active electrode | 300 mm | 300 mm |
| Smallest distance between Active electrode and substrate | 40 mm | 40 mm |
| Diameter of active electrode | 20 mm | 20 mm |
| Milky state | nothing | strong |
| Substrate | Al-coated reflector HMDSO = hexamethyl-disiloxane | |
| Distance subsrate support (28) to activate electrode (5) | 50 mm | 50 mm |

Without any modulation a milky like coating up to a distinctly powder like coating occurred, down to 100 W overage power supplied. The portion of the carrier gas relative to the entire amount of gas amounts preferably to between 0 and 80%.

While there are shown and described present preferred embodiments of the invention, it is to be distinctly understood that the invention is not limited thereto, but may be otherwise variously embodied and practiced within the scope of the following claims.

What is claimed:

1. A coating apparatus, comprising:
   a vacuum chamber;
   a power source for generating a plasma in the vacuum chamber, the power source comprising at least one of:
   an amplitude-modulated alternating signal generator; and
   at least two alternating signal generators of differing signal amplitude, of which the outputs are switched in a timed manner for generating the plasma; and
   at least one alternating signal generator of which the output is switched into the chamber for the generation of the plasma in a timed manner and via differing energy coupling-in means;
   pumping means connected to the chamber for establishing a vacuum in the chamber;
   a controlled gas inlet arrangement for infeed of gas into the chamber; and a gas container arrangement containing a silicon-organic compound connected to the gas inlet arrangement for supplying the compound to the chamber.

2. A coating apparatus according to claim 1, wherein the gas container arrangement contains a liquid silicon-organic compound.

3. A coating apparatus according to claim 1, wherein the gas container arrangement comprises containers for at least one of the following compounds: siloxane and alkyl-/alkoxy-silane.

4. A coating apparatus according to claim 1, wherein the gas container arrangement comprises containers containing at least one of hexamethyl-disiloxane and diethoxy-dimethyl-silane.

5. A coating apparatus according to claim 1, wherein the gas container arrangement contains predominantly hexamethyl-disiloxane.

6. A coating apparatus according to claim 1, wherein the power source has an output and generates at its output an alternating signal which is amplitude modulated between substantially zero and a non-zero amplitude.

7. A coating apparatus according to claim 1, wherein the power source has an output and generates at its output an electromagnetic alternating signal which is amplitude modulated at a constant modulation frequency $f_{MOD}$ of $1\ Hz \leq f_{MOD} \leq 1\ kHz$.

8. A coating apparatus according to claim 1, wherein the power source has an output and generates at its output an amplitude modulated, electromagnetic alternating signal with a carrier frequency $f_o$ between 1 kHz and a microwave frequency in the microwave range.

9. A coating apparatus according to claim 8, wherein the microwave range is at least 0.5 GHz.

10. A coating apparatus according to claim 8, wherein the carrier frequency is between 10 kHz and 500 kHz.

11. A coating apparatus according to claim 1, wherein the plasma is generated in the vacuum chamber by means of at least two electrodes, at least one of the electrodes being provided toward a plasma discharge space with a dielectric coating.

12. A coating apparatus according to claim 1, wherein the plasma is generated between at least two electrodes, at least one of the electrodes being formed by an electrode rod, encapsulated in dielectric material.

13. A coating apparatus according to claim 1, including a gas inlet-device in the chamber which comprises at least one shower head like outlet member.

14. A coating apparatus according to claim 13, wherein the gas inlet-device includes a screen-like gas distributor device downstream of the shower head like member.

15. A coating apparatus according to claim 1, wherein the plasma is generated between at least two electrodes and a gas inlet device located behind one of the electrodes with respect to a plasma discharge between the at least two electrodes.

16. A coating apparatus according to claim 1, wherein a substrate to be coated is non-planar and comprises the shape of a reflector.

17. A coating apparatus according to claim 1, wherein a substrate support is located in the chamber to support the substrate in a discharge space at a floating potential.

18. A coating apparatus according to claim 1, wherein a substrate to be coated has a metal surface.

19. A coating apparatus according to claim 18, wherein the metal surface is made of aluminum.

20. A coating apparatus according to claim 1, wherein the gas inlet arrangement and the pump arrangement open in such a manner into the vacuum chamber that a gas flow occurs substantially in a direction of an electric field generated by the power source in the vacuum chamber.

* * * * *